(12) United States Patent
Ikegami

(10) Patent No.: US 6,939,802 B2
(45) Date of Patent: Sep. 6, 2005

(54) METHOD OF MANUFACTURING A SEMICONDUCTOR DEVICE

(75) Inventor: Masaaki Ikegami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 34 days.

(21) Appl. No.: 10/650,677

(22) Filed: Aug. 29, 2003

(65) Prior Publication Data

US 2004/0058530 A1 Mar. 25, 2004

Related U.S. Application Data

(62) Division of application No. 09/966,071, filed on Oct. 1, 2001, now abandoned.

(30) Foreign Application Priority Data

Apr. 24, 2001 (JP) ........................................ 2001-126588

(51) Int. Cl.[7] .............................................. H01L 21/44
(52) U.S. Cl. ....................... 438/663; 438/660; 438/309; 438/202
(58) Field of Search ................................ 438/652, 660, 438/663, 309, 202

(56) References Cited

U.S. PATENT DOCUMENTS

| 4,769,337 A | 9/1988 | Maeda |
| 5,194,404 A | 3/1993 | Nagatomo |
| 5,328,867 A | 7/1994 | Chien et al. |
| 6,472,287 B2 | 10/2002 | Wakabayashi |

FOREIGN PATENT DOCUMENTS

| JP | 61-080863 | 6/1994 |
| JP | 9-320983 | 12/1997 |

Primary Examiner—Amir Zarabian
Assistant Examiner—Christy Novacek
(74) Attorney, Agent, or Firm—Leydig, Voit & Mayer, Ltd.

(57) ABSTRACT

A semiconductor device having stable device characteristics, in which variation in contact resistance between silicon and poly-silicon or between poly-silicon and poly-silicon is reduced. In a cleaning process before forming an upper layer poly-silicon film, a treatment is conducted to form a thin uniform oxide film on the surface of silicon. After forming the upper layer poly-silicon film 11, a removed portion is uniformly formed on the thin uniform oxide film by applying a short time, high temperature annealing treatment.

3 Claims, 9 Drawing Sheets

PRIOR ART

PRIOR ART

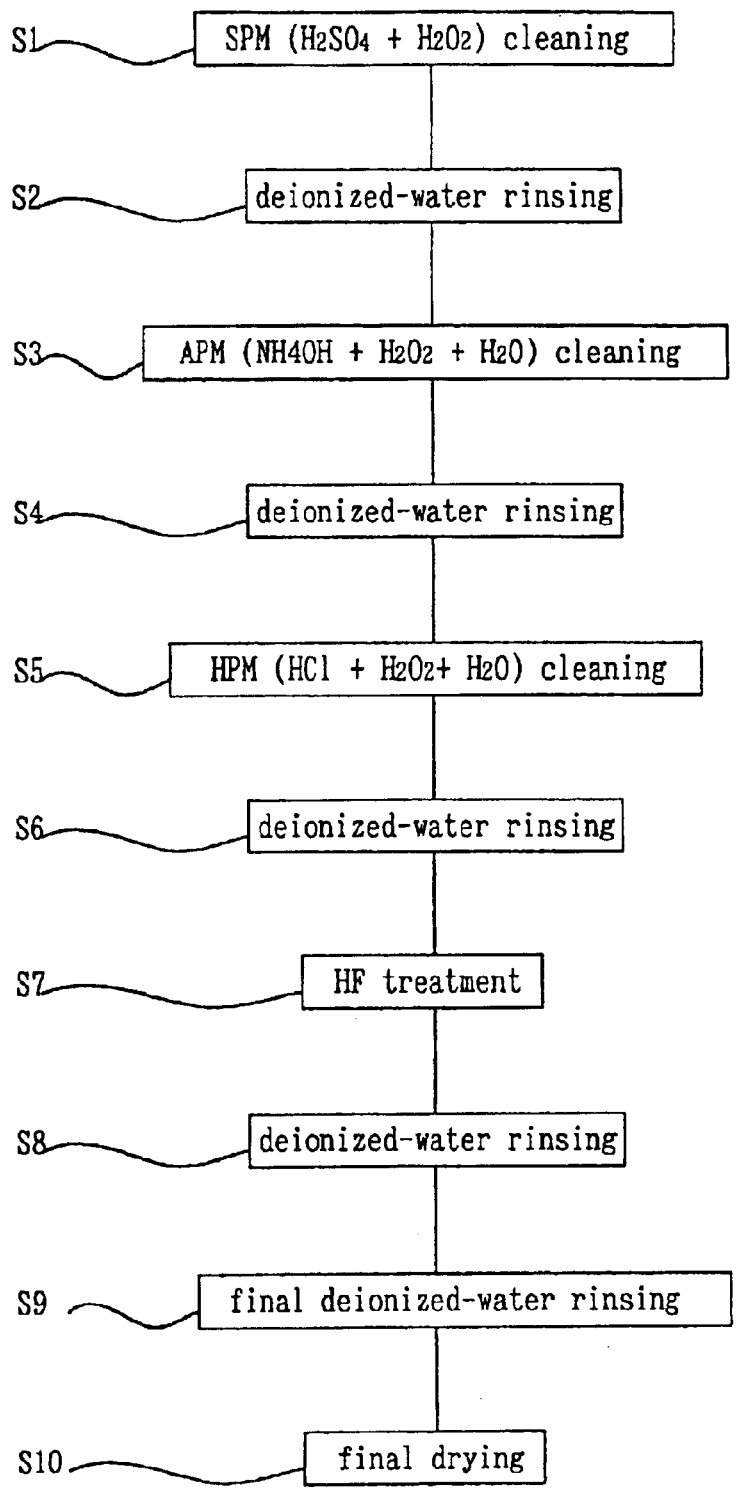

PRIOR ART

METHOD OF MANUFACTURING A SEMICONDUCTOR DEVICE

This application is a division of U.S. patent application Ser. No. 09/966,071, filed on Oct. 1, 2001, abandoned.

BACKGROUND OF THE INVENTION

1. Technical Field

The present invention relates to a semiconductor device and to a method of manufacturing the semiconductor device.

2. Background Art

In order to increase a degree of integration and to simplify a manufacturing process in a BiCMOS semiconductor integrated circuit and the like, it has been conventional to employ a method for forming an electrode through direct contact between refractory materials, such as between silicon and poly-silicon or between poly-silicon and poly-silicon.

FIGS. 5, 6 and 7 are drawings to explain an example of BiCMOS semiconductor device according to a prior art that includes a direct contact portion between the refractory materials and a method of manufacturing thereof. In the drawings, reference numeral 1 is a p-type silicon substrate; numeral 2 is an n-type buried and diffused layer; numeral 3 is an n-type epitaxial layer; numeral 4 is a p-type isolation layer; numeral 5 is a p-type well layer. Numeral 6 is a LOCOS (local oxidation of silicon) oxide film; numeral 7 is a gate insulating oxide film; numeral 8 is a p-type base layer; numeral 9 is an n-type emitter layer; and numeral 10 is a lower layer poly-silicon electrode film. Numeral 11 is an upper layer poly-silicon electrode film; numeral 12 is a WSi electrode film; numeral 13 is a p-type source/drain diffused layer; and numeral 14 is an n-type source/drain diffused layer. Numeral 15 is an interlayer insulating film comprising BPSG (Boro-phospho Silicate Glass) or the like; numeral 16 is a metallic electrode film composed of an AlSiCu film or the like. Numeral 17 is a final passivation film composed of a p-SiN film or the like; and numeral 30 is a natural oxidation film.

Now, a method of manufacturing the BiCMOS semiconductor device in the prior art will be described with reference to FIGS. 6(a)–6(c) and 7(a)–7(c).

First, as shown in FIG. 6(a), the n-type epitaxial layer 3 is formed on the entire surface of the p-type silicon substrate 1 after selectively forming the n-type buried duffused layer 2 in the substrate. Then, the LOCOS oxide film 6 is formed by LOCOS process after forming the p-type isolation layer 4 and the p-type well layer 5. Further, the gate insulating oxide film 7 of about 10 nm to 100 nm in thickness is formed.

Then, as shown in FIG. 6(b), the lower layer poly-silicon electrode film 10 is formed on the entire surface of the substrate by low pressure CVD after selectively forming the p-type base layer 8 by photolithography and ion implantation. Then, the lower layer poly-silicon electrode film 10 and the gate insulating oxide film 7 are selectively etched using a resist formed by photolithography, and arsenic is implanted by ion implantation, whereby the n-type emitter layer 9 is formed.

Then, washing or cleaning of organic residue from the resist and so on used in the photolithography process, is carried out prior to the formation of the upper layer poly-silicon electrode film 11. A series of cleaning processes is shown in FIG. 8. In the final deionized-water rinsing step (S9) and in the drying (IPA vapor drying, spin drying or warm air drying) step (S10) in the cleaning process, it sometimes happens that a natural oxidation film 30 grows with a locally large variation in thickness. The natural oxidation film grows due to a surface oxidation reaction in the chemical processing step and/or reaction of water remaining due to insufficient drying in the drying step.

Then, as shown in FIG. 6(c), arsenic ions are implanted in the entire surface of the upper layer poly-silicon electrode film 11 after forming the upper layer poly-silicon electrode film 11 by low pressure CVD, and then, the arsenic ions implanted in the upper layer poly-silicon electrode film 11 are activated by heat treatment at about 800° C. to 900° C. and diffused into the lower layer poly-silicon electrode film 10, so that the resistance between the upper layer poly-silicon electrode film 11 and the lower layer poly-silicon electrode film 10 is reduced.

Then, as shown in FIG. 7(a), the electrode film 12 of WSi, being one of the low resistant high refractory metal compounds, is formed by sputtering. Subsequently, the WSi electrode film 12, the upper layer poly-silicon electrode film 11, and the lower layer poly-silicon electrode film 10, of which the resistance has been reduced, are selectively etched by photolithography and etching, so that a bi-polar emitter electrode and a MOS gate electrode are formed.

Then, as shown in FIG. 7(b), the p-type source/drain diffused layer 13 and the n-type source/drain diffused layer 14 are selectively formed by photolithography and ion implantation.

Then, as shown in FIG. 7(c), after forming the interlayer insulation film 15 composed of a BPSG film or the like on the entire surface of the substrate, a contact hole is formed by photolithography and etching. Then, the metallic electrode film 16 composed of an AlSiCu film or the like is formed, and finally the final passivation film 17 composed of a p-SiN film or the like is formed. The conventional semiconductor device is manufactured through the above-described process.

Since the conventional semiconductor device including the direct contact portion between the refractory materials, for example, between silicon and poly-silicon, poly-silicon and poly-silicon or the like, has been manufactured through the foregoing procedure, there arise several problems as discussed below.

In the final deionized-water rinsing step (S9) and the drying step (S10) of the cleaning process employed prior to the formation of the upper layer poly-silicon electrode film 11, a natural oxidation film 30 in the form of a stain, referred to as a water-mark, may grow with a locally wide variation in thickness on the surface of the silicon wafer, resulting from a naturally drying water drop on the surface during or after the drying step. However, as the phenomenon of water drop adhesion is a phenomenon depending upon probability, the natural oxidation film 30 is formed, in some cases, on the interface between the n-type emitter layer 9 and the upper layer poly-silicon electrode film 11 as shown in FIG. 9(a), while in some other cases, not formed as shown in FIG. 9(b). In the connection between the n-type emitter layer 9 and the upper layer poly-silicon electrode film 11, it is ideal that the natural oxidation film 30 is not formed and the contact resistance is low as shown FIG. 9(b). However, in actual practice, as shown in FIG. 9(a), the natural oxidation film 30 with large variation in local thickness is usually formed on the interface between the n-type emitter layer 9 and the upper layer poly-silicon electrode film 11, whereby variation in contact resistance occurs. Moreover, in the BiCMOS portion, as the arsenic ions implanted in the upper layer poly-silicon electrode film 11 through the natural oxidation film 30 with the wide variation of local thickness are diffused in the lower layer poly-silicon electrode film 10, the state of diffusion of the arsenic ions varies from place to place in the lower layer poly-silicon electrode film 10. As a result, a problem exists in that something abnormal takes place in device characteristics.

SUMMARY OF THE INVENTION

The present invention was made to resolve the above-discussed problem and has an object of providing a semiconductor device having stability in device characteristics, in which variation in contact resistance between silicon and poly-silicon or between poly-silicon and poly-silicon is reduced. Another object of the invention is to provide a method of manufacturing suitable for the semiconductor device.

A semiconductor device according to the invention comprises; a silicon semiconductor layer of first conductivity type; an insulating oxide film having an opening and laminated on the mentioned silicon semiconductor layer of first conductivity type; a first poly-silicon film formed on the mentioned insulating oxide film and having an opening located at the same position as the opening formed in the mentioned insulating oxide film; an impurity diffused layer of second conductivity type formed on an exposed portion of the mentioned silicon semiconductor layer of first conductivity type, the exposed portion being exposed through the openings of the mentioned insulating oxide film and the mentioned first poly-silicon film; a second poly-silicon film formed on the mentioned first poly-silicon film and in the mentioned openings; and a thin uniform oxide film serving as a contact and having a removed portion uniformly formed between the mentioned impurity diffused layer of second conductivity type and the mentioned second poly-silicon film and between the mentioned first poly-silicon film and the mentioned second poly-silicon film.

A method of manufacturing a semiconductor device according to the invention comprises the steps of: laminating an insulating oxide film and a first poly-silicon film sequentially in order on a silicon semiconductor layer of first conductivity type; forming an opening by selectively etching the mentioned insulating oxide film and the mentioned first poly-silicon film and exposing a part of the mentioned silicon semiconductor layer of first conductivity type through the mentioned opening; forming an impurity diffused layer of second conductivity type by implanting an impurity of second conductivity type into the exposed portion of the mentioned silicon semiconductor layer of first conductivity type; removing a natural oxidation film from the mentioned impurity diffused layer of second conductivity type and the mentioned first poly-silicon film by applying HF (hydrofluoric acid) treatment; forming a thin uniform oxide film on the surface of the mentioned impurity diffused layer of second conductivity type and on the surface of the mentioned first poly-silicon film from which the natural oxidation film has been removed; forming a second poly-silicon film on the entire surface of the substrate and implanting the impurity of second conductivity type in the mentioned second poly-silicon film; activating the mentioned impurity of second conductivity type implanted in the mentioned second poly-silicon film and diffusing the mentioned impurity of second conductivity type into the mentioned first poly-silicon film through the mentioned thin uniform oxide film; and forming uniformly a removed portion in the mentioned thin uniform oxide film by applying a high temperature annealing treatment for a short time and forming a thin uniform oxide film serving as contact having the uniformly formed removed portion.

It is preferable that the thin uniform oxide film is formed by H2O2 (hydrogen peroxide) treatment.

It is preferable that the thin uniform oxide film is about 0.5 nm to 10 nm in thickness.

It is preferable that temperature in the high temperature annealing treatment for a short time is about 950° C. to 1150° C., and treating time is about 10 sec to 3 min.

As described above, in the invention, by providing the H2O2 treatment in the cleaning process prior to the formation of the upper layer poly-silicon film, a thin uniform oxide film of about 0.5 nm to 10 nm in thickness (to the extent of permitting the impurity to diffuse through the film) is formed on the surface of the lower layer silicon or poly-silicon film, and after forming the upper layer poly-silicon film, a removed portion is uniformly formed in the thin uniform oxide film by applying the high temperature annealing treatment for a short time using RTP (Rapid Thermal Process). As a result, variation in contact resistance between the upper layer poly-silicon film and the lower layer silicon or poly-silicon film is reduced. Furthermore, by diffusing the impurity into the lower layer poly-silicon film through the thin uniform oxide film in the BiCMOS structure portion, it becomes possible to obtain a semiconductor device having stable device characteristics.

BRIEF DESCRIPTION OF THE DRAWING

FIG. 8 is a flow chart showing cleaning steps in the manufacturing process of the semiconductor device according to the prior art.

FIGS. 9(a)–9(c) are views to explain problems incidental to the semiconductor device according to prior art.

DESCRIPTION OF THE PREFERRED EMBODIMENTS

Embodiment 1.

A BiCMOS semiconductor device and a method of manufacturing the same according to the preferred embodiment of the present invention is hereinafter described with reference to the accompanying drawings.

Figure 1:
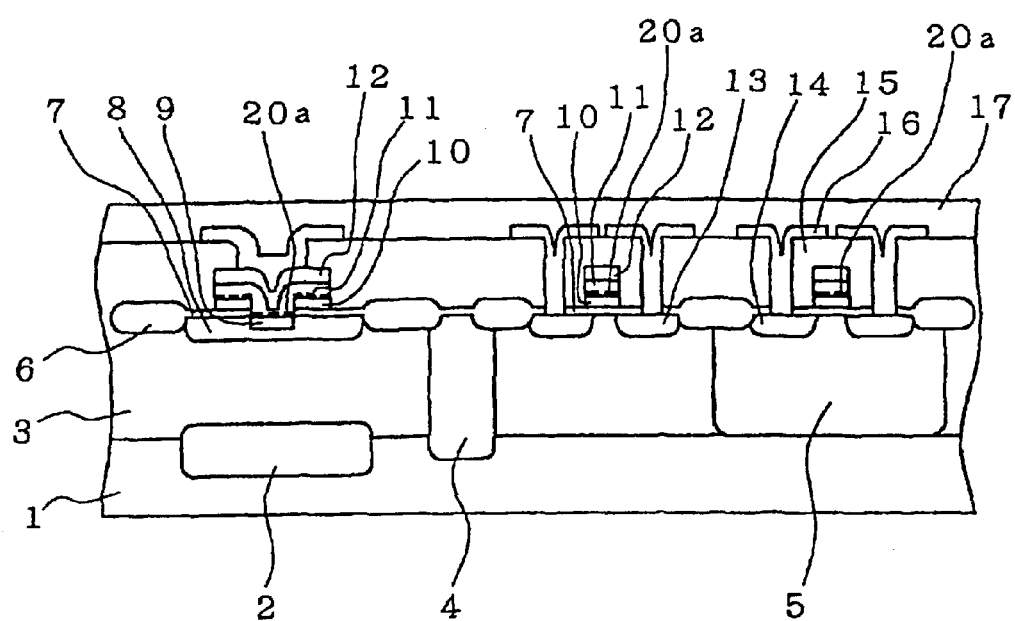
FIG. 1 is a cross sectional view showing a semiconductor device according to Embodiment 1 of the present invention.

FIG. 1 is a cross sectional view showing a semiconductor device according to Embodiment 1 of the invention. FIGS. 2(a)–2(c) and 3(a)–3(c) are cross sectional views showing a manufacturing process of the semiconductor device according to Embodiment 1 of the invention.

In the drawings, reference numeral 1 is a p-type silicon substrate, numeral 2 is an n-type buried duffused layer, numeral 3 is an n-type epitaxial layer, and numeral 4 is a p-type isolation layer. Numeral 5 is a p-type well layer, numeral 6 is a LOCOS (Local Oxidation of Silicon) oxide film, numeral 7 is a gate insulating oxide film, numeral 8 is a p-type base layer, and numeral 9 is an n-type emitter layer. Numeral 10 is a lower layer poly-silicon electrode film, numeral 11 is an upper layer poly-silicon electrode film, and numeral 12 is a WSi electrode film. Numeral 13 is a p-type source/drain diffused layer, and numeral 14 is an n-type source/drain diffused layer. Numeral 15 is an interlayer insulating film comprising BPSG (Boro-phospho Silicate Glass) or the like, and numeral 16 is a metallic electrode film comprising an AlSiCu film or the like. Numeral 17 is a final passivation film composed of a p-SiN film or the like, numeral 20 is a thin uniform oxide film, and numeral 20a is an oxide film including a removed portion uniformly formed.

Now, a method of manufacturing the BiCMOS semiconductor device is described below.

Figure 2A:
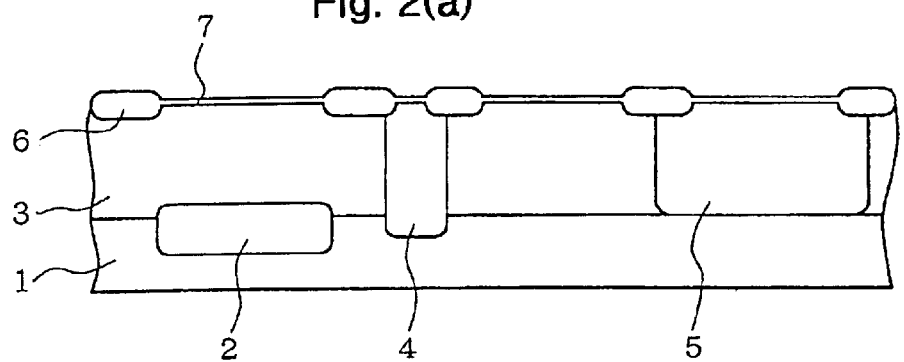
FIGS. 2(a)–2(c) are cross sectional views each showing a manufacturing process of the semiconductor device according to Embodiment 1 of the invention.

First, as shown in FIG. 2(a), after selectively forming the n-type buried duffused layer 2 in the substrate, the n-type epitaxial layer 3 is formed on the entire surface of the p-type silicon substrate 1. Then, the LOCOS oxide film 6 is formed by the LOCOS process after forming the p-type isolation layer 4 and p-type well layer 5. Subsequently, the gate insulating oxide film 7 of about 10 to 100 nm in thickness is formed.

Figure 2B:
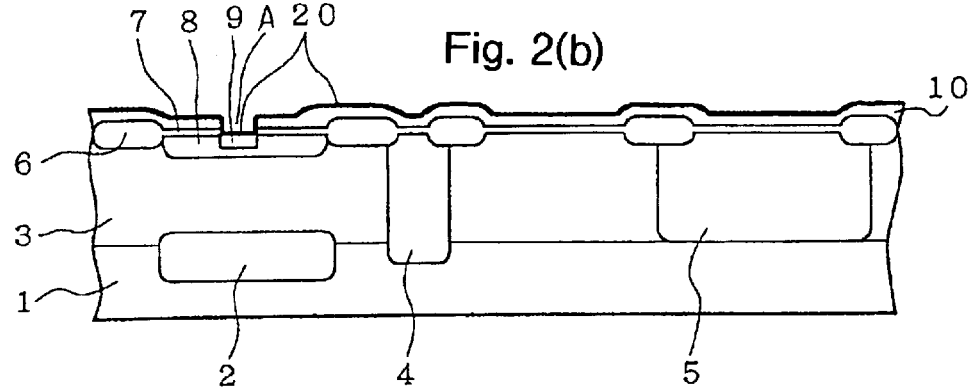

Then, as shown in FIG. 2(b), after selectively forming the p-type base layer 8 by photolithography process and ion implantation process, the lower layer poly-silicon electrode film 10 is formed on the entire surface of the substrate by low pressure CVD process. Subsequently, the lower layer poly-silicon electrode film 10 and the gate insulating oxide film 7 are selectively etched using a resist formed by the photolithography process to form an opening A. Further, an n-type impurity such as arsenic is implanted through this opening by ion implantation process, whereby the n-type emitter layer 9 is formed.

Figure 4:
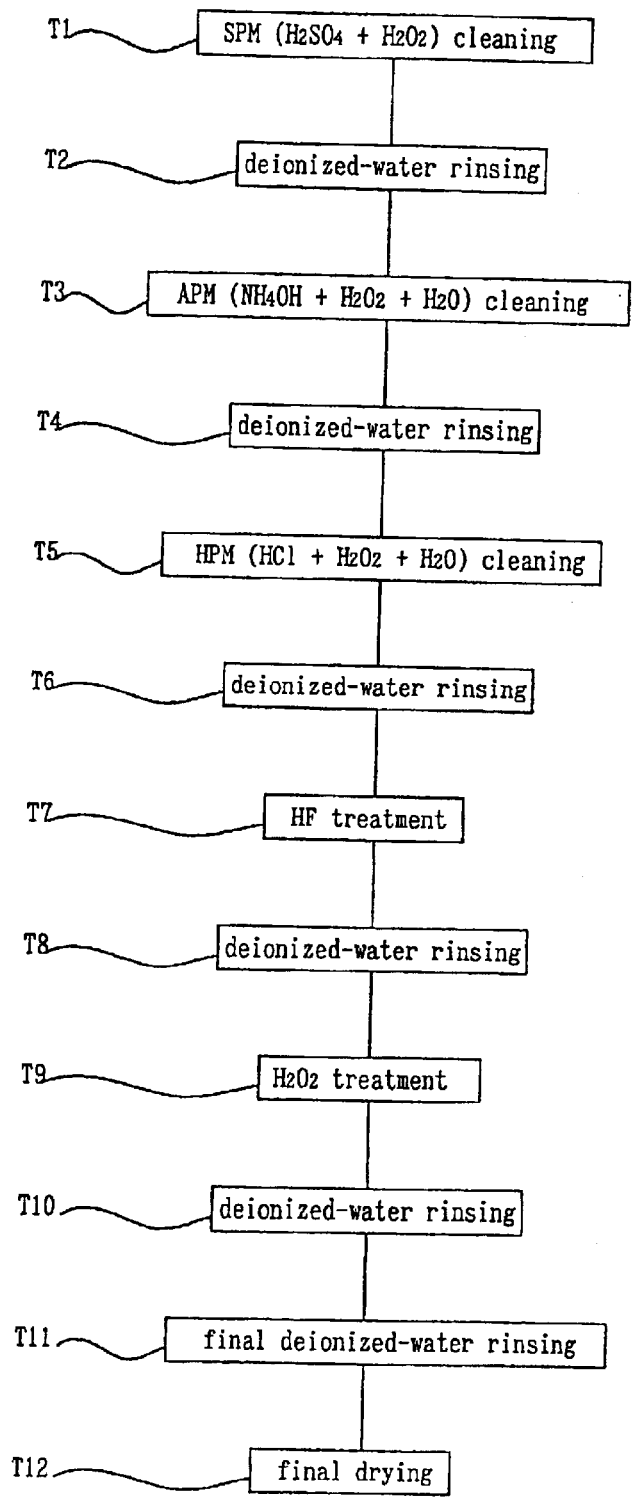
FIG. 4 is a flow chart showing cleaning steps in the manufacturing process of the semiconductor device according to Embodiment 1 of the invention.
Figure 5:
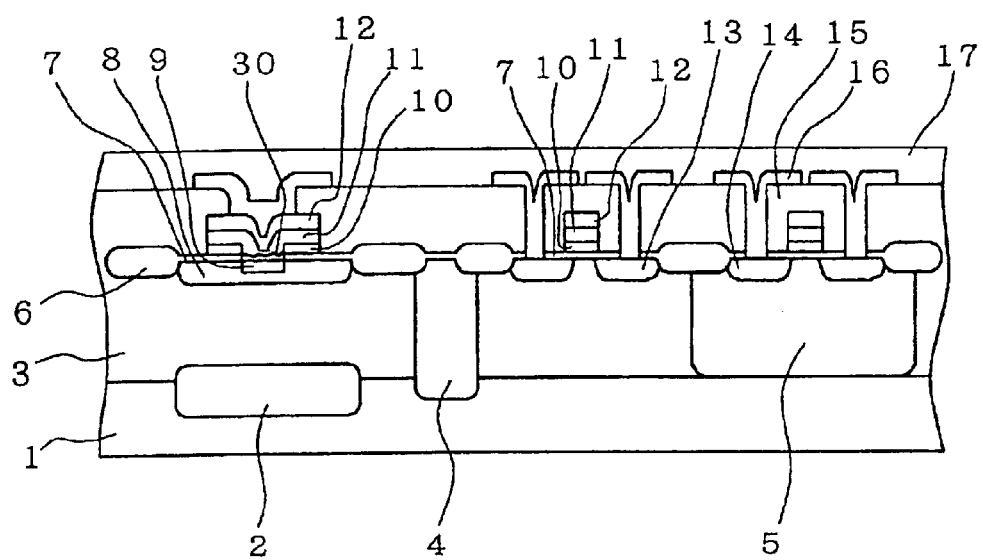
FIG. 5 is a cross sectional view showing a semiconductor device of this type according to the prior art.
Figure 6A:
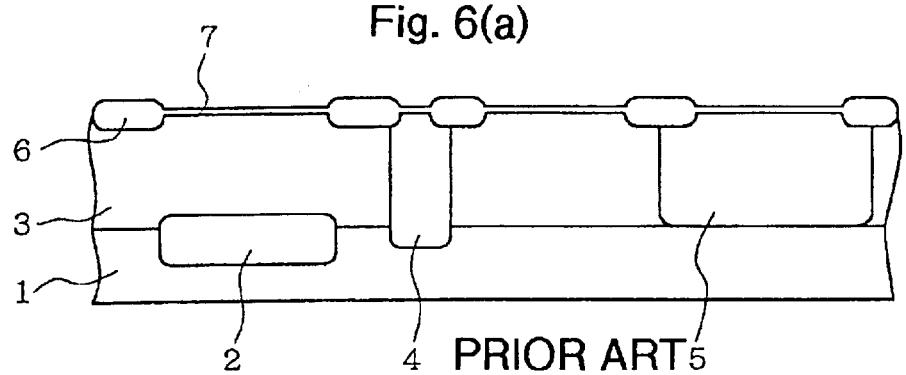
FIGS. 6(a)–6(c) are cross sectional views each showing a manufacturing process of the semiconductor device according to the prior art.
Figure 6B:
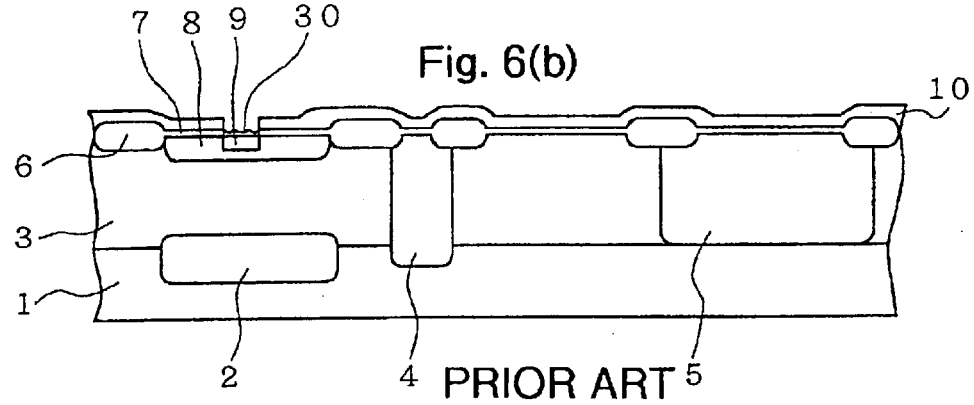
Figure 6C:
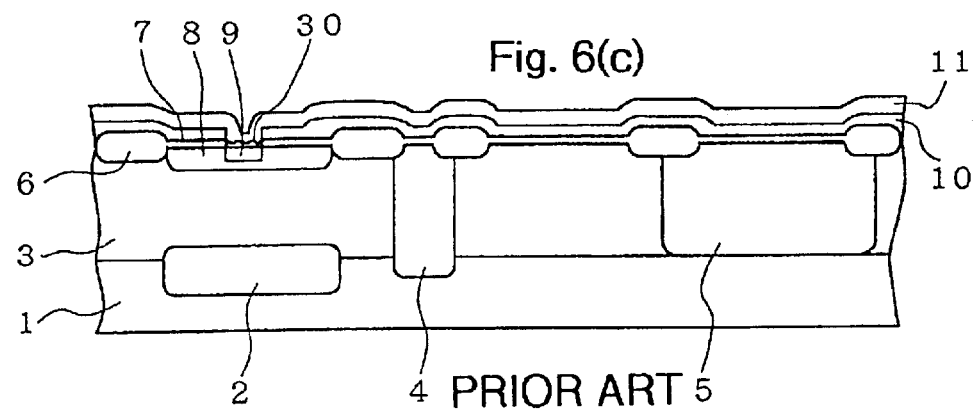
Figure 7A:
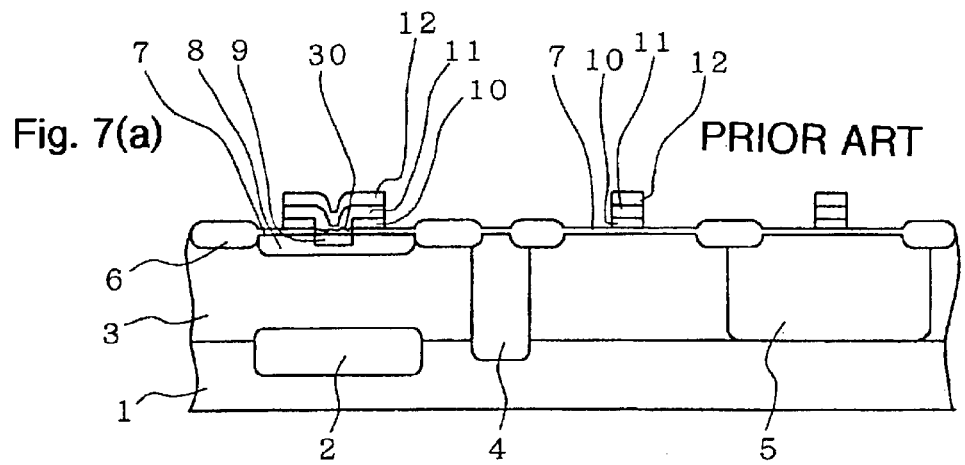
FIGS. 7(a)–7(c) are cross sectional views each showing a manufacturing process of the semiconductor device according to the prior art.
Figure 7B:
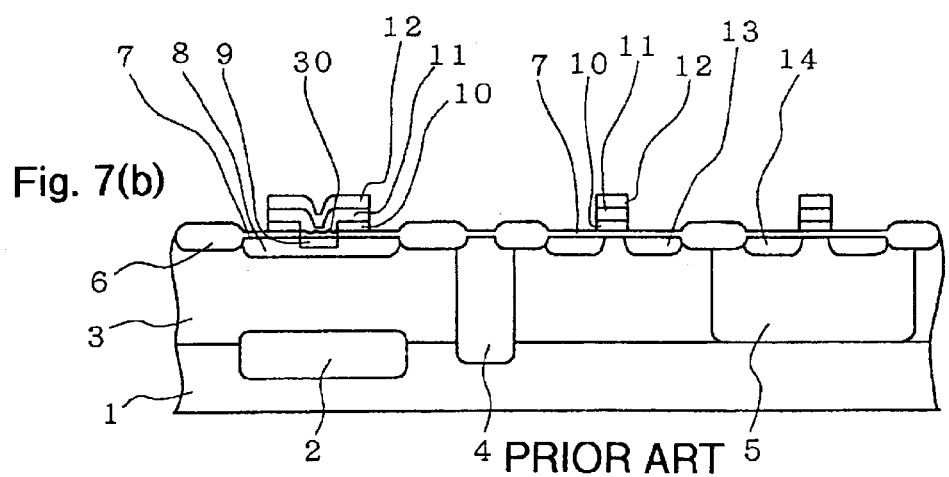
Figure 7C:
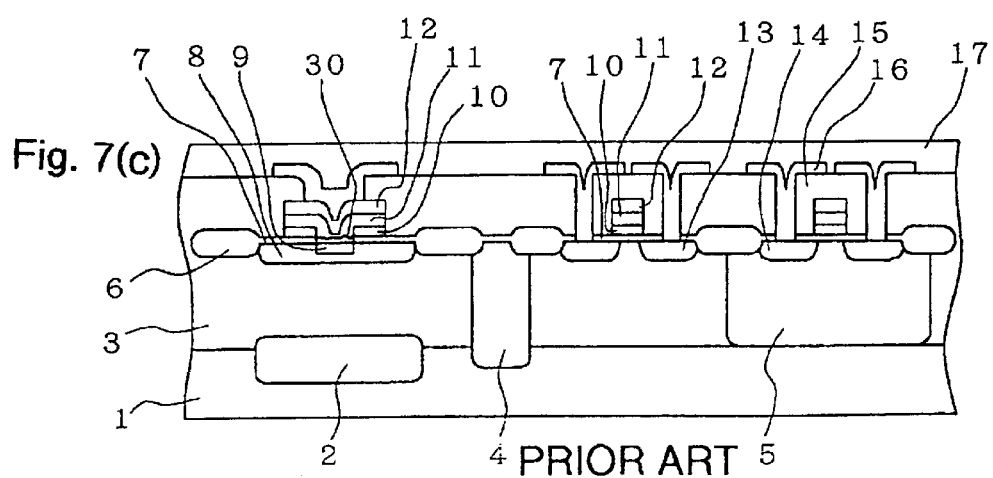
Figure 9A:
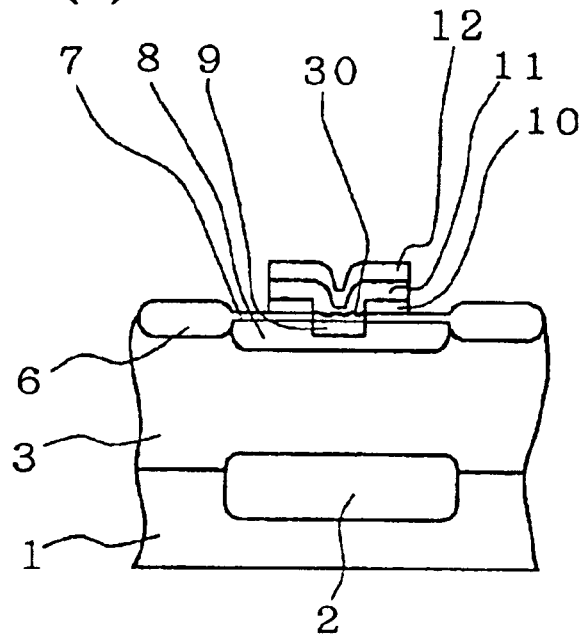
Figure 9B:
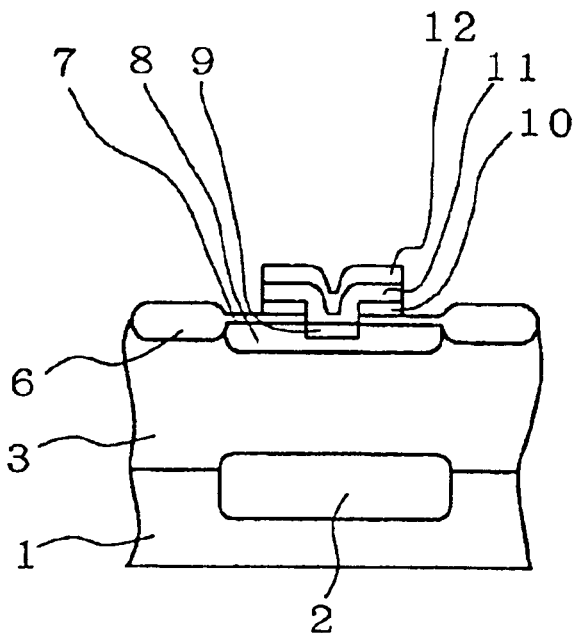

Then, cleaning is carried out according to the flow chart shown in FIG. 4, prior to the formation of the upper layer poly-silicon electrode film 11. The cleaning process comprises the steps of SPM (H2SO4+H2O2) cleaning (T1), deionized-water rinsing (T2), APM (NH4OH+H2O2+H2O) cleaning (T3), deionized-water rinsing (T4), HPM (HCl+H2O2+H2O) cleaning (T5), deionized-water rinsing (T6), HF treating (T7), deionized-water rinsing (T8), H2O2 treating (T9), deionized-water rinsing (T10), final deionized-water rinsing (T11) and final drying (T12). The H2O2 treating step (T9) is carried out prior to the final deionized-water rinsing step (T11) so that the thin uniform oxide film 20 of about 0.5 nm to 10 nm in thickness is formed on the surface of the n-type emitter layer 9 and the lower layer poly-silicon electrode film 10, thereby imparting hydrophilicity on the entire surface. Subsequently, chemicals are removed in the final deionized-water rinsing step (T11). Further, drying is carried out in the final drying step (T12) using IPA vapor dry, spin dry, hot air dry or the like. Meanwhile, during or after drying in the final drying step (T12), each water drop adhering on the surface can naturally dry out as the water drop spreads without being retained by surface tension due to hydrophilicity of the thin uniform oxide film 20 existing on the surface.

Figure 2C:
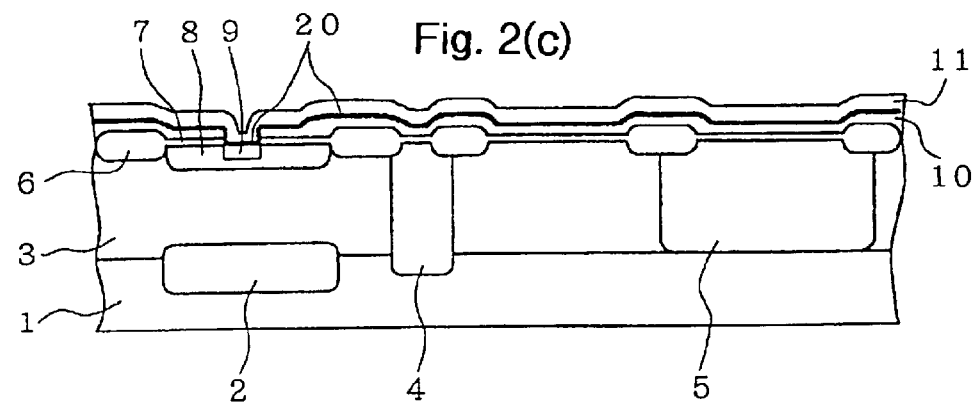

Then, as shown in FIG. 2(c), the upper layer poly-silicon electrode film 11 is formed by low pressure CVD process using a CVD formation equipment in which atmosphere is preliminarily replaced with a cold oxygen (O2) free atmosphere, e.g., nitrogen (N2) atmosphere. Thereafter, an n-type impurity, e.g., arsenic is ion-implanted in the entire surface of the upper layer poly-silicon electrode film 11. The arsenic ion implanted in the upper layer poly-silicon electrode film 11 is then activated by heat treatment at about 800° C. to 900° C. As a result, the arsenic ion is evenly diffused into the lower layer poly-silicon electrode film 10 through the thin uniform oxide film 20, whereby resistance of the upper layer poly-silicon electrode film 11 and the lower layer poly-silicon electrode film 10 is reduced.

Then, a short time high temperature annealing treatment is carried out by RTP (Rapid Thermal Process) for about 3 min. at about 950° C. to 1150° C. In this annealing step, the thin uniform oxide film 20 is uniformly broken and removed by viscous flow so as to form a thin uniform oxide film for contact 20a which accomplishes a contact between the upper layer poly-silicon electrode film 11 and the n-type emitter layer 9. At the same time, a contact is made between the upper layer poly-silicon electrode film 11 and the lower layer poly-silicon electrode film.

Figure 3A:
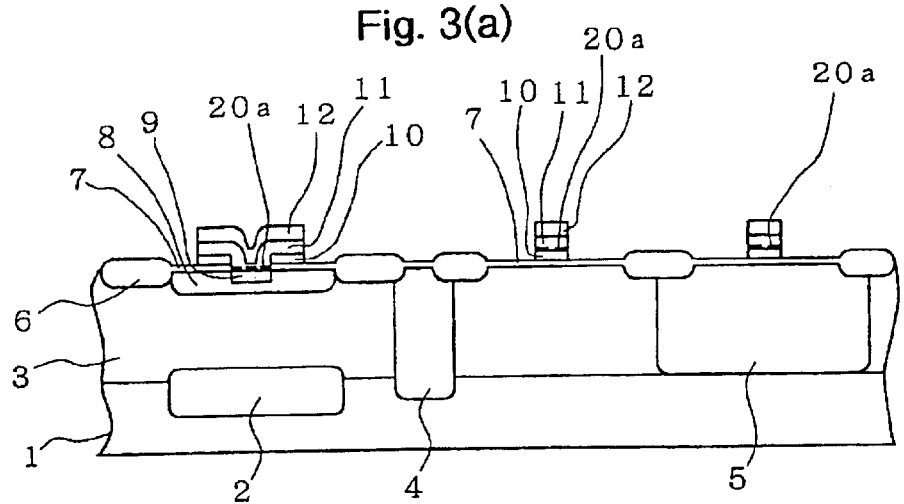
FIGS. 3(a)–3(c) are cross sectional views each showing a manufacturing process of the semiconductor device according to Embodiment 1 of the invention.

Then, as shown in FIG. 3(a), the WSi electrode film 12 being one of the low resistant refractory metals is formed by spattering method. Further, the upper layer poly-silicon electrode film 11 and the lower layer poly-silicon electrode film 10 respectively of reduced resistance, as well as the WSi electrode film and the oxide film for contact 20a are selectively etched by photolithography process and etching, whereby a bi-polar emitter electrode and a MOS gate electrode are formed.

Figure 3B:
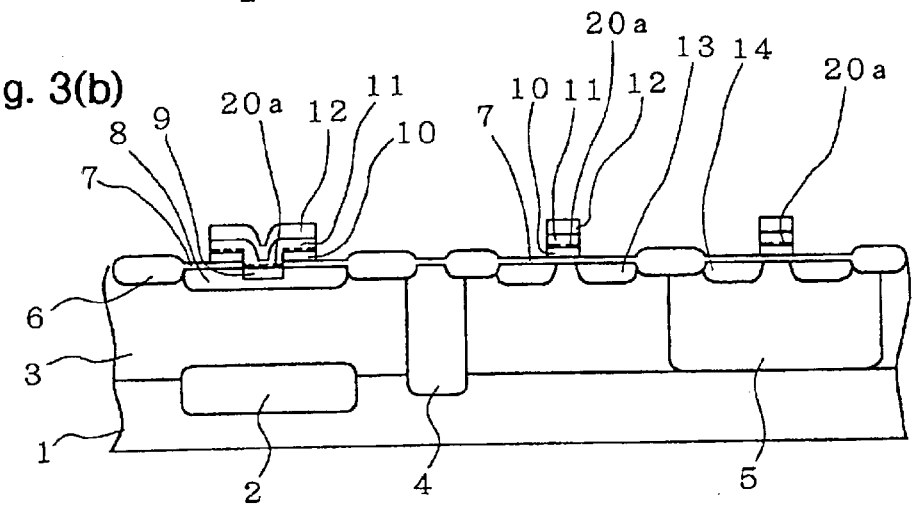

Then, as shown in FIG. 3(b), the p-type source/drain diffused layer 13 and the n-type source/drain diffused layer 14 are selectively formed by photolithography process and ion implantation process.

Figure 3C:
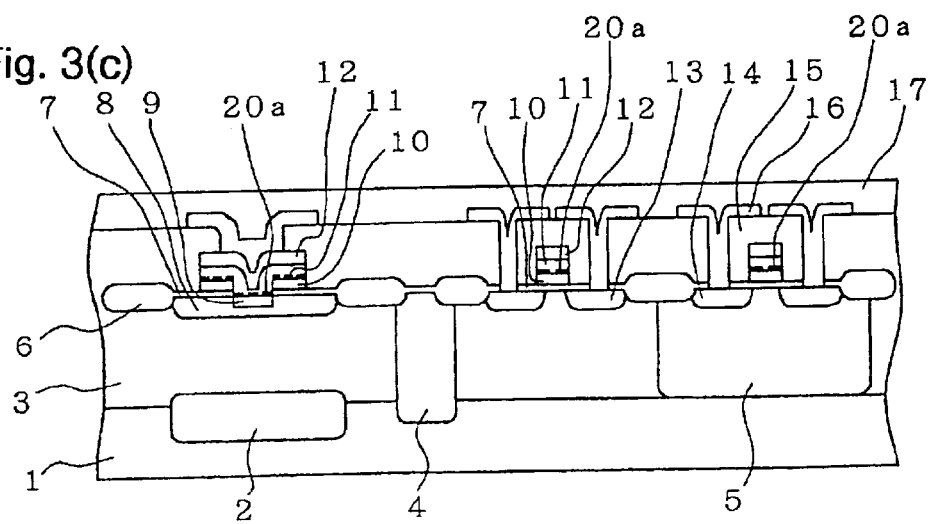

Then, as shown in FIG. 3(c), after forming the interlayer insulation film 15 composed of a BPSG film or the like on the entire surface, a contact hole is formed by photolithography process and etching. Subsequently, the metallic electrode film 16 composed of an AlSiCu film or the like is formed and finally the final passivation film 17 composed of a p-SiN film or the like is formed. Thus, a semiconductor device is manufactured through the above-described process.

In addition, the short time high temperature annealing treatment by RTP is not necessarily required to be carried out strictly in order of the steps described above, but may be carried out in any step after completing the formation of the upper layer poly-silicon electrode film 11.

Although the n-type emitter layer 9 is formed by selectively implanting the n-type impurity into the p-type base layer 8 on the p-type silicon substrate 1 in the semiconductor device according to this embodiment, the same advantage is achieved also in a semiconductor device in which an n-type emitter layer is formed by selectively implanting an n-type impurity directly into a p-type silicon substrate.

In this embodiment, during the cleaning process before forming the upper layer poly-silicon electrode film 11, the H2O2 treatment is carried out prior to the final deionized-water rinsing step, a thin uniform oxide film 20 of about 0.5 nm to 10 nm in thickness is formed on the surface of the n-type emitter layer 9 as well as on the surface of the lower layer poly-silicon electrode film 10, and after forming the upper layer poly-silicon electrode film 11, the short time high temperature annealing treatment is applied by RTP. Accordingly, a removed portion can be uniformly formed in the thin uniform oxide film. As a result, the variation not only in contact resistance between the upper layer poly-silicon electrode film 11 and the n-type emitter layer 9, but also in contact resistance between the upper layer poly-silicon electrode film 11 and the lower layer poly-silicon electrode film 10 are reduced, resulting in stable device characteristics.

Furthermore, by limiting the thickness of the oxide film 20 formed on the surface of the lower layer poly-silicon electrode film 10 to a thickness such that the impurity implanted in the upper poly-silicon electrode film 11 can be diffused into the lower layer poly-silicon electrode film 10 through the oxide film 20, the diffusion state of the impurity in the lower layer poly-silicon electrode film 10 can be made uniform.

What is claimed is:

1. A method of manufacturing a semiconductor device comprising:

laminating an insulating oxide film and a first poly-silicon film sequentially, in order, on a silicon layer of a first conductivity type;

forming an opening by selectively etching said insulating oxide film and said first poly-silicon film and exposing a part of said silicon layer in the opening;

forming an impurity doped region of a second conductivity type by implanting a dopant impurity producing the second conductivity type into the part of said silicon layer exposed in the opening;

removing a natural oxidation film from said impurity doped region and said first poly-silicon film with hydrofluoric acid;

forming a thin uniform thickness oxide film on said impurity doped region in the opening and on said first poly-silicon film from which the natural oxidation film has been removed;

forming a second poly-silicon film covering said first poly-silicon film, including in the opening, and implanting the dopant impurity producing the second conductivity type in said second poly-silicon film;

activating the impurity producing the second conductivity type and implanted in said second poly-silicon film, and diffusing the dopant impurity producing the second conductivity type into said first poly-silicon film through said thin uniform thickness oxide film; and forming openings in said thin uniform thickness oxide film by annealing at a temperature from about 950° C. to 1150° C. for a time period of at least ten seconds and up to about three minutes, thereby forming an electrical contact between said second poly-silicon film and said impurity doped region through said first poly-silicon film.

2. The method of manufacturing a semiconductor device according to claim 1, including forming said thin uniform thickness oxide film by treating with hydrogen peroxide.

3. The method of manufacturing a semiconductor device according to claim 1, wherein said thin uniform thickness oxide film is about 0.5 nm to 10 nm thick.

* * * * *